United States Patent [19]

Kunz et al.

[11] Patent Number: 4,777,462

[45] Date of Patent: Oct. 11, 1988

[54] EDGE COUPLER MAGNETOSTATIC WAVE STRUCTURES

[75] Inventors: William E. Kunz, Foster City; Kok W. Chang, Sunnyvale, both of Calif.; Giuseppe Miccoli, Rome, Italy

[73] Assignee: Hewlett-Packard Company, Palo Alto, Calif.

[21] Appl. No.: 94,959

[22] Filed: Sep. 9, 1987

[51] Int. Cl.$^4$ .......................... H01P 7/00; H01P 1/20
[52] U.S. Cl. ................... 333/219; 333/202; 333/235; 333/245; 333/246
[58] Field of Search ............... 333/24.1, 201, 204, 333/205, 161, 219, 202, 203, 141, 148, 150–155, 193–196, 235, 246, 245; 310/26

[56] References Cited

U.S. PATENT DOCUMENTS 4,314,214  2/1982  Castera et al. ................. 333/141
4,528,529  7/1985  Huijer ........................... 333/219

OTHER PUBLICATIONS

"Tunable Magnetostatic Volume Wave Oscillator" by J. P. Casters, et al., *IEEE MTT-S International Microwave Symposium Digest* (1983).

"Compact Magnetostatic Wave Channelizer" by Michael R. Daniel and J. D. Adam, 1986 *IEEE MTT-S International Microwave Symposium Digest*, p. 481.

Primary Examiner—Marvin L. Nussbaum
Attorney, Agent, or Firm—John A. Frazzini

[57] ABSTRACT

A magnetostatic wave structure in which magnetostatic wave signals are coupled between discrete magnetostatic wave elements without the use of microstrip transducers. This structure consists of a plurality of blocks of ferrimagnetic material in which each block has an edge close enough to an edge of another block that a magnetostatic wave in the first of these blocks couples across the gap between these two edges into the second of these blocks. Linear and nonlinear configurations are presented that include a band pass filter.

14 Claims, 2 Drawing Sheets

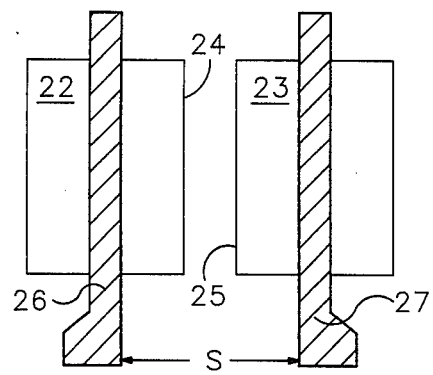
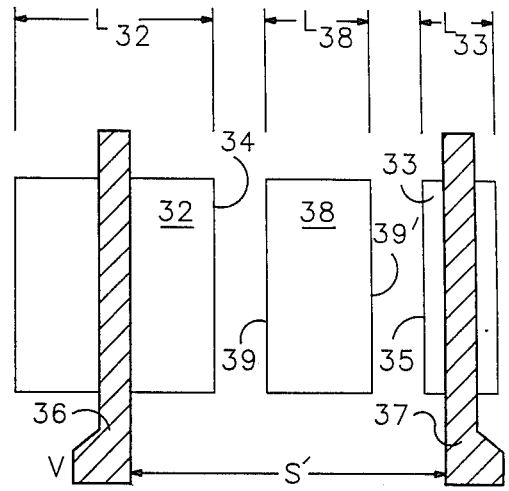
FIG 2    FIG 3
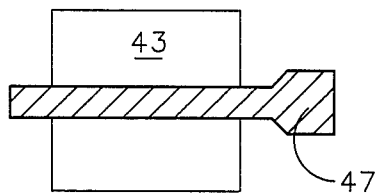
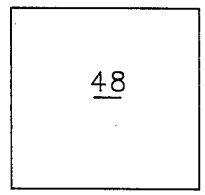
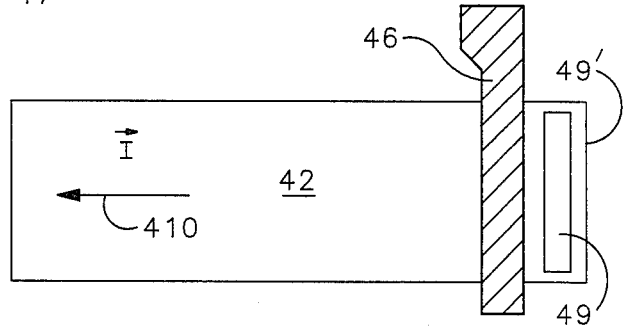
FIG 4

EDGE COUPLER MAGNETOSTATIC WAVE STRUCTURES

BACKGROUND OF THE INVENTION

This invention relates in general to magnetostatic wave structures and relates more particularly to the coupling between such structures. Yttrium-Iron-Garnet (YIG) devices are widely used in combination with an applied magnetic field to accomplish wide band tuning in microwave circuits. These YIG devices are typically coupled by microstrip conductors. In the case of a YIG sphere, the microstrip conductor partially encircles the sphere in order to strongly couple to the magnetic field associated with the YIG sphere. Changes in the magnetic field surrounding the YIG sphere induces in this conductor a current which is carried by the conductor to an area within the magnetic field of another YIG sphere.

In recent years, thin film YIG devices have been developed which function as resonators and delay lines. In U.S. Pat. No. 4,528,529 entitled MAGNETOSTATIC WAVE RESONATOR issued to Ernst Huijer on July 9, 1985 is presented a magnetostatic wave resonator that uses a thin rectangular film of yttrium-iron-garnet to carry the magnetostatic waves. The magnetostatic waves reflect at the ends of this YIG film to produce a resonant structure. These YIG devices also utilize microstrip conductors to convert the variations in the magnetic field near the YIG film into a current that is carried by the microstrip conductor to another device. Unfortunately, the energy transmitted from one device to another is reduced by the conduction and radiation losses of the microstrip conductors.

Magnetostatic Wave (MSW) resonators have been produced that utilize shallow etched gratings or overlying metal gratings to selectively couple to particular wavelengths of the magnetostatic waves in the resonator (See, for example, the article by J.P. Casters, et al entitled A TUNABLE MAGNETOSTATIC VOLUME WAVE OSCILLATOR in the *IEEE MTT-S International Microwave Symposium Digest* (1983)). Unfortunately, these structures have a very high loss and their performance is critically dependant on the etch depth and metal thickness, respectively, of the gratings. Therefore, it would be advantageous to have a low loss coupling mechanism between MSW devices.

In the article entitled COMPACT MAGNETOSTATIC WAVE CHANNELIZER by Michael R. Daniel and J. D. Adam, 1986 *IEEE MTT-S International Microwave Symposium Digest*, p. 481 is presented a channelizer in which a set of long rectangular blocks of yttrium iron garnet are mounted on a substrate in a parallel arrangement so that a first end of each of these blocks is located under a single input transducer. This input transducer launches magnetostatic waves in each of these blocks. Each block has it own output transducer so that this arrangement functions as a set of parallel channels for the signal input at the input transducer. A tapered magnet applies a magnetic field to these blocks that varies from one to the next so that each exhibits a different frequency response. In order to eliminate crosstalk between these blocks, magnetic shielding is located between each pair of adjacent blocks.

SUMMARY OF THE INVENTION

In accordance with the illustrated preferred embodiment, a coupling mechanism is presented for coupling together magnetostatic wave (MSW) devices that utilize thin films of a ferrimagnetic material such as yttrium-iron-garnet. A pair of such thin film devices are coupled together by mounting the two thin films on a substrate such that the spacing between these two films is small enough that a magnetic wave propagating toward the edge of a first of these thin films launches a magnetic wave into the other thin film.

The magnetic field produced by the YIG film extends beyond the sides as well as beyond the ends of the thin film. Thus, the signals in two YIG films can be coupled by closely spacing the two YIG films either end to end or side by side. In general, these ends and sides of adjacent blocks will be parallel so that a wave that is parellel or perpendicular to an end of one block will also be parallel or perpendicular to an end of the adjacent block. However, in some applications, these sides or ends of adjacent blocks will be intentionally aligned at an angle that coupled a particular wave mode in one block to a different mode in the adjacent block. Different types of thin film devices can also be coupled. For example, this coupling scheme can be used to couple a thin film YIG delay line to a thin film YIG resonator. Likewise, two or more resonators of differing lengths can be coupled together in this manner to produce a wide band resonator.

DESCRIPTION OF THE FIGURES

FIG. 2 is a top view of a pair of one port resonators coupled in the manner illustrated in FIG. 1.

FIG. 3 illustrates how a third magnetostatic device can be used to couple a first and second magnetostatic device.

FIG. 4 illustrates that the magnetostatic wave devices can be coupled in a nonlinear arrangement.

FIG. 5 illustrates the wide band filter response $S_{21}$ that can be achieved by coupling together a plurality of resonators having closely spaced fundamental resonant frequencies.

DESCRIPTION OF THE PREFERRED EMBODIMENT

Figure 1:
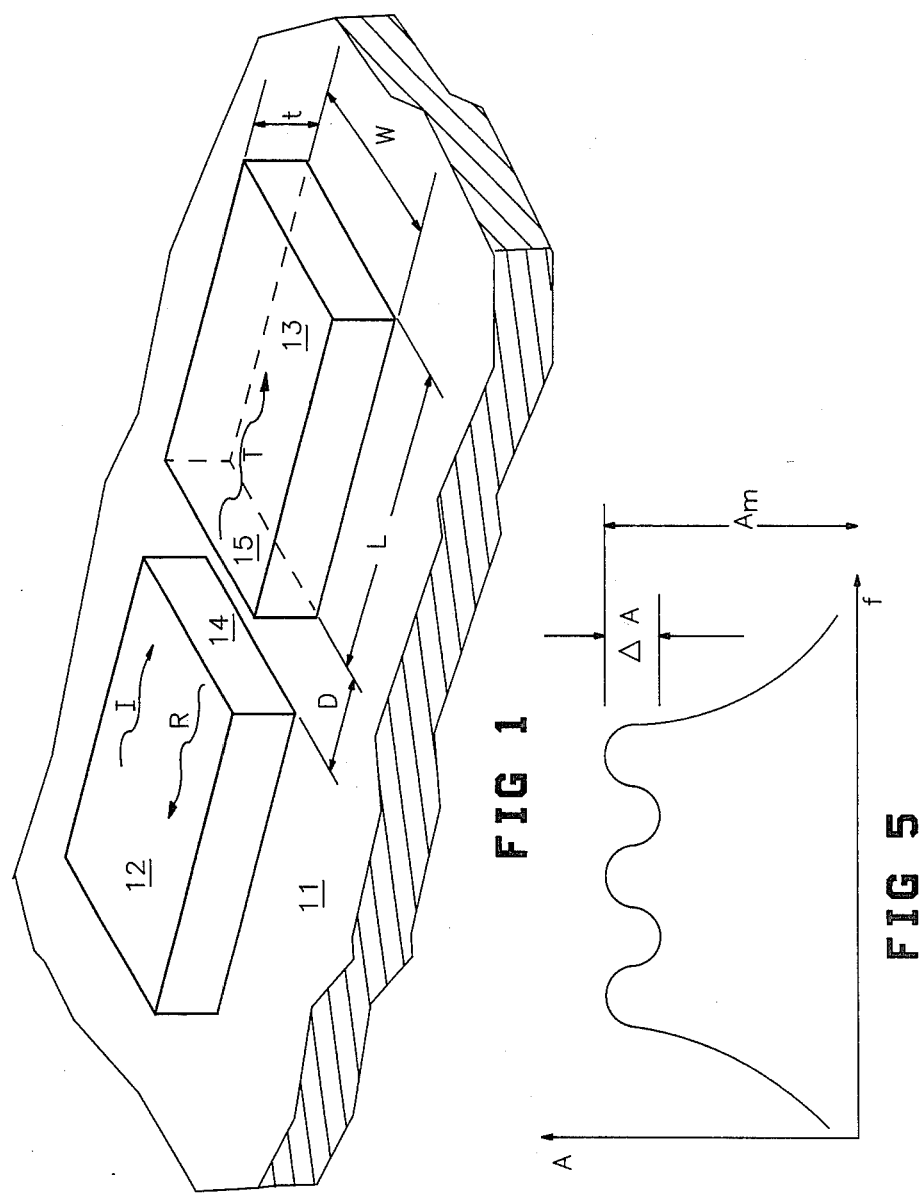
FIG. 1 illustrates the magnetic coupling between two closely spaced magnetostatic wave devices that arises from the interaction of the magnetic field of one with the magnetic dipoles in the other.

In the figures, the first digit of the reference numerals indicates the first figure in which the element indicated by that reference numeral is depicted. The reference numerals of analogous elements in different figures will have the same second digit.

In FIG. 1 is illustrated a new type of coupling between two or more magnetostatic wave devices without use of interconnecting conductors. On a substrate 11, of a dielectric material, such as gadolinium gallium garnet, quartz or sapphire, are formed a pair of blocks 12 and 13 of a thin film of a ferromagnetic material, such a yttrium-iron-garnet (YIG). Blocks 12 and 13 can be formed by cutting these blocks from a thin YIG film by use of a wafer saw and then mounting them on substrate 11 or they can be formed by growing by liquid phase epitaxy (LPE) a thin YIG film on the gadolinium gallium garnet and then patterning it by photolithographic techniques to produce blocks 12 and 13. This latter method is preferred because of the ease of manufacture, the accuracy of alignment of the blocks and the smoothness of the edges of the blocks.

When a magnetostatic wave I travels toward an end 14 of block 12, the magnetic field produced by this wave will interact with the magnetic dipoles in block 13 and will launch a wave T in that block. Thus, at end 14, part of the incident wave I will be reflected into a reflected wave R in block 12 and part of the incident will launch a transmitted wave T in block 13. Thus, by positioning blocks 12 and 13 so that the distance D between a pair of adjacent ends 14 and 15 is small enough, a strong coupling will result between the signals in these two blocks. Typically, the thickness t of blocks 12 and 13 is on the order of 100 microns. Since it is difficult to chemically etch, in a 100 micron film, a groove of width much less than 100 microns, the distance D will typically be on the order of or greater than 100 microns. An anisotropic etch process can be used to etch walls 14 and 15, but such an anisotropic etch process would take a much longer time than an isotropic chemical etch and therefore will generally not be the preferred method of forming blocks 12 and 13. However, in embodiments in which a spacing closer than 100 microns is required, an anisotropic etch process could be used.

The lengths L of the YIG blocks are on the order of 800-1000 microns and the widths W of the YIG blocks are on the order of 2000-3000 microns so that the spacing between the blocks is typically much smaller than the wavelength of the fundamental resonant modes of the YIG blocks. As a result of this, there is a very strong coupling between the two blocks. In general, the spacing between the blocks is selected to be on the order of or less than a few times the wavelength of the fundamental mode of each block and is preferrably selected to be less than 1/16 of the wavelength of the fundamental mode to achieve strong coupling.

In FIG. 2 is illustrated an embodiment in which a pair of one port resonators are coupled together in the manner illustrated in FIG. 1. In FIG. 2, a first resonator (consisting of a block 22 of YIG film and a microstrip tranducer 26) and a second resonator (consisting of a block 23 of YIG film and a microstrip transducer 27) are positioned with closely spaced edges 24 and 25. This combination functions as a two port resonator in which transducer 26 functions as the input port and transducer 27 functions as the output port.

Unfortunately, transducer 26 not only generates magnetostatic waves in block 26, it also generates radio waves that can interact directly with transducer 27. Such direct action is a spurious coupling between these two transducers that does not exhibit the resonant behavior produced by the magnetostatic waves in blocks 22 and 23. Because of the relatively close spaing of the first and second resonators, this direct coupling will be more significant than in previous coupling methods in which the first and second resonators will generally be spaced at a greater distance.

In FIG. 3 is presented a resonator in which this direct coupling via the radio waves between the input and output transducer is reduced. In this embodiment, the first resonator consists of a block 32 of YIG film and a microstrip transducer 36. The second resonator consists of a clock 33 of YIG film and a microstrip transducer 37. An additional block 38 of YIG film is located between blocks 32 and 33 to couple the first resonator to the second resonator. A first end 39 of block 38 is positioned close to an end 34 of block 32 in order to couple the signal from block 32 into block 38. A second end 39' of block 38 is positioned close to an end 35 of block 33 to couple the signal from block 38 into block 33. The spacing S' between transducers 36 and 37 is much greater than the spacing between transducers 26 and 27 in FIG. 2 so that the direct electromagnetic wave coupling, which drops off roughly as the inverse square of the distance between the transducers, is significantly reduced in the embodiment of FIG. 3 compared to the embodiment in FIG. 2.

In FIG. 4 is presented a magnetostatic wave device in which a magnetostatic wave delay line (consisting of a block 42 of YIG film and a transducer 46) is coupled in a nonlinear arrangement to a magnetostatic wave resonator (consisting of a flock 43 of YIG film and a microstrip transducer 47). The delay line includes an absorbing medium 49, such as a thin coating of metal particles, to absorb magnetostatic waves travelling toward an end 49' of the magnetostatic wave delay line. Therefore, an input signal at transducer 46 launches a magnetostatic wave I in block 42 in the direction indicated by arrow 410. This magnetostatic wave I launches a magnetostatic waves in YIG block 48 and these magnetostatic waves in turn induce magnetostatic waves in block 43. This embodiment illustrates that different types of magnetostatic wave devices can be coupled together by the coupling illustrated in FIG. 1 and also illustrates that such couplings need not be in a strictly linear arrangement.

In FIG. 5 is presented a plot of the transfer function $S_{21}$ between input transducer 36 and output transducer 37 as a function of the frequency f of a sinusoidal signal V applied to input transducer 36. The lengths of blocks 32, 33 and 38 are $L_{32}$, $L_{33}$ and $L_{38}$, respectively so that blocks 32, 33 and 38 have a resonant wavelength $\lambda_{32}$, $\lambda_{33}$ and $\lambda_{38}$, respectively, where $\lambda_{32}=2L_{32}/m$, $\lambda_{33}=2L_{33}/n$ and $\lambda_{38}=2L_{38}/p$ for some nonzero positive integers m, n and p. These integers and lengths are chosen so that the associated resonant frequencies $f_{32}$, $f_{33}$ and $f_{38}$ of these three resonators are closely enough spaced so that the transfer function is substantially flat between a minimum frequency $f_{min}$ and a maximum frequency $f_{max}$. This flatness is measured by the amplitude $\Delta A$ of the ripple in the transfer function between $f_{min}$ and $f_{max}$. The spacing between these resonant peaks is selected to make this ripple be less than some preselected value, typically on the order of 0.5 dB. To achieve this, for three peaks of substantially equal height, the separation $f_{k+1}-f_k$ (for k=1,2) between adjacent peaks is on the order of $(\Delta f_k+\Delta f_{k+1})/2$, where $\Delta f_k$ is the halfwidth of the kth resonant peak. When the amplitudes of the peaks are not substantially equal, the separations between adjacent peaks in the range from $f_{min}$ to $f_{max}$ will be chosen to substantially minimize $\Delta A$ over that frequency range. Thus, this combination functions as a band pass filter instead of as a resonator.

In the embodiments shown in FIGS. 1-4, the adjacent edges of adjacent blocks (e.g., edges 14 and 15 of blocks 12 and 13, respectively) are generally aligned to be substantially parallel. Because of this, waves travelling substantially perpendicular to edge 14 in Figure 1 launch waves in block 13 substantially perpendicular to edge 15. When blocks 12 and 13 have the same length and width, a given mode of wave in block 12 will stimulate the same mode in block 13. However, in some applications, it may be advantageous to couple into different modes. In such applications, the adjacent edges will be selected to be nonparallel.

We claim:

1. A magnetostatic wave structure comprising:
 a first rectangular block of ferrimagnetic material of length L and width W having a first end;
 means for launching a magnetostatic travelling wave I in said first block toward said first end, said wave I producing an associated electromagnetic field that extends past the first end of the first block; and
 a second block of ferrimagnetic material having a second end positioned end to end with the first end and located within a distance D, equal to the smaller of 4L and 4W, to the first end of the first block so that said electromagnetic field produced by magnetostatic wave I interacts directly with the ferrimagnetic material in the second block thereby launching a magnetostatic wave T in said second block, said blocks having no magnetic shielding between said first and second ends, whereby this configuration couples signals in said first block into said second block.

2. A magnetostatic wave structure as in claim 1 wherein the first and second ends are substantially parallel.

3. A magnetostatic wave structure as in claim 2 wherein the first and second blocks have fundamental resonant modes that have wavelengths much greater than the spacing between the first and second ends.

4. A magnetostatic wave structure as in claim 1, wherein said second block also contains a third end, said structure further comprising:
 a third block of ferrimagnetic material having a fourth end located close enough to the third end of the second block that an electromagnetic field produced by a magnetostatic wave travelling in said second block toward said third end produces an associated electromagnetic field that extends past the third end of the second block with sufficient amplitude that it interacts directly with the ferrimagnetic material of the third block to launch, without means of any additional coupling, a magnetostatic wave in said third block.

5. A magnetostatic wave structure as in claim 4 wherein the second and third blocks have fundamental resonant modes that have wavelengths much greater than the spacing between the third and fourth ends.

6. A magnetostatic wave structure as in claim 1 wherein the first and second blocks are the mth and (m+1)st blocks (for some integer m in the range $0 < m < N+1$) in an ordered set of blocks $1, \ldots, N$ (where N is greater than 1 of ferrimagnetic material, wherein, for $k=1, \ldots, N-1$, the kth block has an end located close enough to an end of the (k+1)st block that an electromagnetic field produced by a magnetostatic wave in said kth block extends with sufficient amplitude into the (k+1)st block that, through direct coupling with the ferrimagnetic material of the (k+1)st block, launches a magnetostatic wave in said (k+1)st block and an electromagnetic field produced by a magnetostatic wave in the (k+1)st block extends with sufficient amplitude into the kth block that it launches a magnetostatic wave in said kth block, whereby signals launched in the mth block are coupled into the other blocks.

7. A magnetostatic wave structure as in claim 6 further comprising:
 means for sensing magnetostatic waves in the pth block, for some integer p in the range $1 \leq p \leq N$, and for generating an output signal in response to the magnetostatic waves sensed in the pth block.

8. A magnetostatic wave structure as in claim 7 wherein the absolute value $|m-p|$ is greater than 1, whereby the spacing between said means for launching magnetostatic waves and said means for sensing magnetostatic waves is increased over the spacing that would result for $|m-p|=1$, whereby any direct electromagnetic coupling between said means for launching and said means for sensing that is not transmitted by magnetostatic waves in said blocks is reduced.

9. A magnetostatic wave structure as in claim 6 wherein the blocks are aligned in a linear configuration.

10. A magnetostatic wave structure as in claim 6 wherein the blocks are aligned in a nonlinear configuration.

11. A magnetostatic wave structure as in claim 6 wherein, for a preselected choice of $f_{min}$ and $f_{max}$, the blocks have dimensions such that, for the kth block for $k=1, \ldots, N$, there exists a resonance peak at a frequency $f_k$ and the $f_k$ are spaced so that said means for launching and said means for sensing exhibit a transfer function that is substantially flat between $f_{min}$ and $f_{max}$.

12. A magnetostatic wave structure as in claim 11 wherein the resonance frequencies are such that the transfer function has a ripple component in the interval between $f_{min}$ and $f_{max}$ that is less than a preselected value $\Delta A$.

13. A magnetostatic wave structure as in claim 11 wherein the resonance peaks at the frequencies $f_k$ have substantially equal amplitudes and wherein $f_{k+1}-f_k$ is on the order of $(\Delta f_{k+1}+\Delta f_k)/2$, where $\Delta f_j$ is the halfwidth of the resonant peak at the frequency $f_j$.

14. A magnetostatic wave structure as in claim 1 wherein the first and second blocks have fundamental resonant modes that have wavelengths much greater than the spacing between the first and second ends.

* * * * *